United States Patent
Kluth et al.

(10) Patent No.: US 6,992,370 B1
(45) Date of Patent: Jan. 31, 2006

(54) MEMORY CELL STRUCTURE HAVING NITRIDE LAYER WITH REDUCED CHARGE LOSS AND METHOD FOR FABRICATING SAME

(75) Inventors: George J. Kluth, Campbell, CA (US); Robert B. Clark-Phelps, San Jose, CA (US); Joong S. Jeon, Cupertino, CA (US); Huicai Zhong, Wappinger Falls, NY (US); Arvind Halliyal, Cupertino, CA (US); Mark T. Ramsbey, Sunnyvale, CA (US); Robert B. Ogle, Jr., San Jose, CA (US); Kuo T. Chang, Saratoga, CA (US); Wenmei Li, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/655,179

(22) Filed: Sep. 4, 2003

(51) Int. Cl.
*H01L 23/58* (2006.01)
*H01L 21/302* (2006.01)

(52) U.S. Cl. ............. 257/640; 257/649; 257/760; 438/257; 438/724; 438/774

(58) Field of Classification Search ............. 257/354, 257/640, 649, 760; 438/257, 724, 744, 754, 438/757, 769, 791, 954
See application file for complete search history.

(56) References Cited

U.S. PATENT DOCUMENTS

| 6,596,576 | B2 * | 7/2003 | Fu et al. .............. 438/230 |
| 6,642,103 | B2 * | 11/2003 | Wils et al. ............ 438/257 |
| 6,740,605 | B1 * | 5/2004 | Shiraiwa et al. ....... 438/795 |
| 2003/0216000 | A1 * | 11/2003 | Beaman et al. ........ 438/257 |

* cited by examiner

*Primary Examiner*—David Nelms
*Assistant Examiner*—Long Tran
(74) *Attorney, Agent, or Firm*—Farjami & Farjami LLP

(57) ABSTRACT

According to one embodiment, a memory cell structure comprises a semiconductor substrate, a first silicon oxide layer situated over the semiconductor substrate, a charge storing layer situated over the first silicon oxide layer, a second silicon oxide layer situated over the charge storing layer, and a gate layer situated over the second silicon oxide layer. In the exemplary embodiment, the charge storing layer comprises silicon nitride having reduced hydrogen content, e.g., in the range of about 0 to 0.5 atomic percent. As a result, the reduced hydrogen content reduces the charge loss in the charge storing layer. The reduced charge loss in the charge storing layer has the benefit of reducing threshold voltage shifts, programming data loss, and programming capability loss in the memory device, thereby improving memory device performance.

12 Claims, 4 Drawing Sheets

_US 6,992,370 B1_

MEMORY CELL STRUCTURE HAVING NITRIDE LAYER WITH REDUCED CHARGE LOSS AND METHOD FOR FABRICATING SAME

TECHNICAL FIELD

The present invention relates generally to the field of semiconductor devices. More particularly, the present invention relates to semiconductor memory devices.

BACKGROUND ART

Memory devices are known in the art for storing data in a wide variety of electronic devices and applications. More recently, SONOS (Silicon Oxide Nitride Oxide Silicon) type memory devices have been introduced. SONOS type flash memory cells comprise a gate stack having a gate layer situated over an ONO (Oxide Nitride Oxide) stack. The gate stack is situated over a semiconductor substrate where a channel region is defined between first and second terminals regions in the semiconductor substrate, thereby forming a transistor.

The ONO stack comprises a non-conductive dielectric layer, typically a silicon nitride layer ("nitride layer"), positioned between two silicon oxide layers. The nitride layer functions as an electric charge storing medium. Moreover, the nitride layer is capable of locally storing an electrical charge on one side of the nitride layer independent of an electrical charge stored on an opposite side of the nitride layer. Thus, SONOS type memory cells can be described as capable of storing two binary bits, e.g., a left bit and a right bit.

Conventional techniques for forming the nitride layer of the ONO stack produce a number of negative effects, which detrimentally affect the performance of the memory device. Typically, the nitride layer is formed using a chemical vapor deposition ("CVD") process with a precursor consisting of silicon hydride ($SiH_4$) ("silane") and ammonia ($NH_3$), or dichlorosilane ($SiH_2Cl_2$) ("DCS") and ammonia. During the CVD process, the nitrogen-hydrogen bond in ammonia and/or the silicon-hydrogen bond in silane or DCS desirably break. When these bonds break, the hydrogen atoms react with each other to form stable $H_2$ molecules which are pumped out of the reaction chamber. However, a substantial number of the nitrogen-hydrogen bonds and/or the silicon-hydrogen bonds do not break and will remain in the nitride film of the ONO stack. As a consequence, the resulting nitride layer will have substantial hydrogen content, typically in the range of about 1 to 2 atomic percent. The sizable content of hydrogen in the nitride layer becomes detrimental, for example, when energetic electrons are injected into the nitride layer during subsequent programming cycles. These electrons may break the nitrogen-hydrogen bonds and/or the silicon-hydrogen bonds in the nitride layer, freeing a substantial number of hydrogen atoms ("hydrogen radicals"). The presence of hydrogen radicals in the nitride layer produces a charge loss in the nitride layer, resulting in such negative effects as a shift in the threshold voltage of the memory cell, which results in unpredictable memory device behavior. Furthermore, the charge loss in the nitride layer may further result in the loss of programming data and/or programming capability in the memory cell. The hydrogen radicals may also migrate into the adjacent oxide layers, such as the top and bottom layers of the ONO stack and further degrade device properties. These negative effects result in poor performance of the memory device.

Accordingly, there exists a strong need in the art for a memory cell structure and method for fabricating a memory cell structure having a nitride layer with significantly reduced charge loss.

SUMMARY

The present invention is directed to a memory cell structure having nitride layer with reduced charge loss and method for fabricating same. The present invention addresses and resolves the need in the art for a memory cell structure which results in reduced threshold voltage shifts, reduced programmed data loss, reduced programming capability loss, and reduced device degradation.

According to one exemplary embodiment, the memory cell structure comprises a semiconductor substrate, a first silicon oxide layer situated over the semiconductor substrate, a charge storing layer situated over the first silicon oxide layer, a second silicon oxide layer situated over the charge storing layer, and a gate layer situated over the second silicon oxide layer. In the exemplary embodiment, the charge storing layer comprises silicon nitride having reduced hydrogen content, e.g., in the range of about 0 to 0.5 atomic percent. This reduced hydrogen content corresponds to a reduced hydrogen radical content which may be freed in the charge storing layer due to subsequent programming operations. As a result, the reduced hydrogen content in the charge storing layer reduces the charge loss in the charge storing layer. The reduction in charge loss in the charge storing layer has the benefit of reducing threshold voltage shifts, programming data loss, and programming capability loss in the memory device, thereby improving memory device performance. Reduced hydrogen content further corresponds to reduced hydrogen migration into adjacent layers.

The first silicon oxide layer, the charge storing layer, the second silicon oxide layer, and the gate layer form a gate stack having sidewalls. According to one exemplary embodiment, the memory cell structure further comprises spacers adjacent to the sidewalls of the gate stack. In this particular embodiment, each of the spacers comprises silicon nitride having reduced hydrogen content. As a benefit, the reduced hydrogen content in the spacers reduces the charge loss in the charge storing layer and the hydrogen migration into adjacent layers, thereby further improving memory device performance.

According to another exemplary, the charge storing layer is capable of storing two bits where, for example, the memory cell structure is used in a SONOS type memory device. In another embodiment, the invention is a method for fabricating the above-discussed structures. Other features and advantages of the present invention will become more readily apparent to those of ordinary skill in the art after reviewing the following detailed description and accompanying drawings.

DETAILED DESCRIPTION OF THE INVENTION

The present invention is directed to a memory cell structure having nitride layer with reduced charge loss and method for fabricating same. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
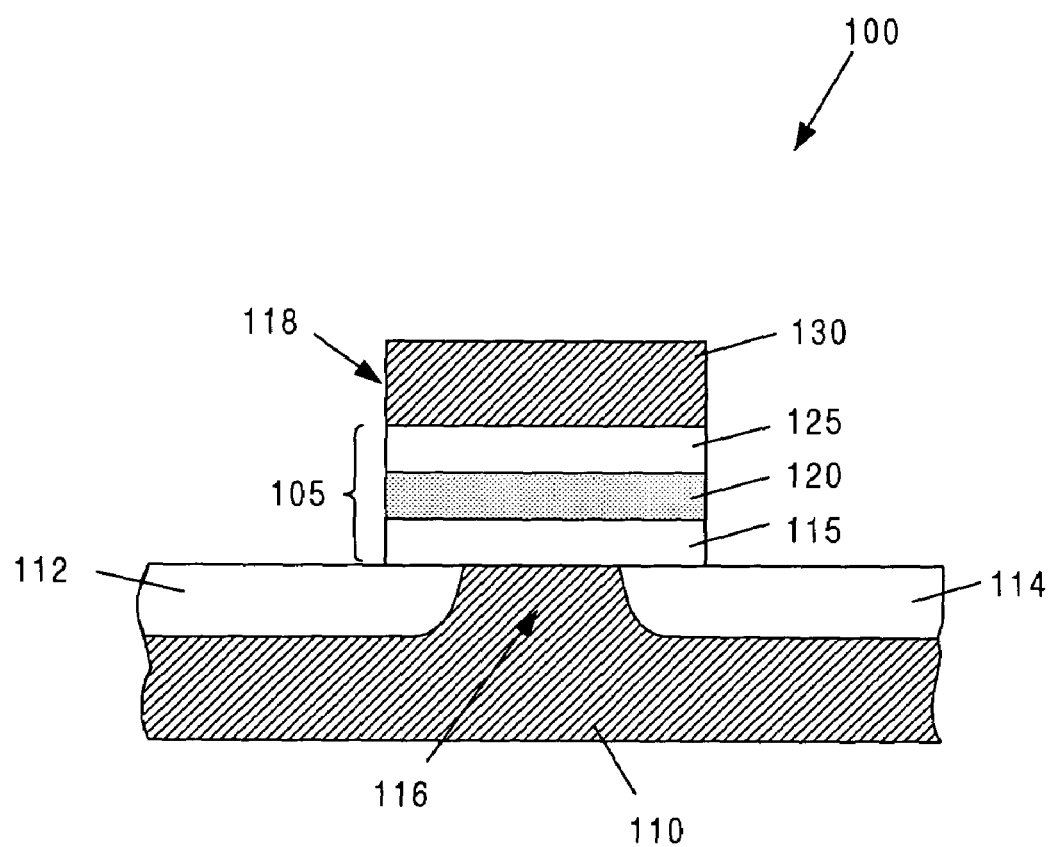
FIG. 1 depicts an exemplary memory cell structure having a nitride layer with significantly reduced charge loss according to one embodiment of the present invention.

FIG. 1 depicts exemplary memory cell structure 100 according to one embodiment of the present invention. As described more fully below, nitride layer 120 of memory cell structure 100 has a significantly reduced charge loss compared to known memory cell structures, which results in significantly improved memory device performance.

Memory cell structure 100 can, for example, be used in a SONOS type memory device. For example, memory cell structure 100 can be utilized for storing two independent bits in separate location within the memory cell, such as Advanced Micro Devices, Inc. (AMD) MirrorBit™ memory devices, to achieve high-density flash memory devices. Memory cell structure 100 comprises silicon substrate 110, wherein terminal region 112 and terminal region 114 are formed opposite each other across channel region 116. In a SONOS type memory device, terminal region 112 may be configured as a drain terminal, and terminal region 114 may be configured as a source region during certain operations, e.g., for writing, reading or erasing a first bit. During other operations, terminal region 114 may be configured as a drain terminal, and terminal region 112 may be configured as a source region, e.g., for writing, reading or erasing a second bit.

As shown in FIG. 1, memory cell structure 100 includes gate stack 118 situated over substrate 110 to form a transistor. Gate stack 118 comprises ONO stack 105 and gate layer 130 situated over ONO stack 105. First oxide layer 115 of ONO stack 105 comprises silicon oxide ($SiO_2$) ("oxide"), and is situated over channel region 116 of substrate 110. Nitride layer 120 is situated over first oxide layer 115 and functions as a charge storing layer for memory cell structure 100. Nitride layer 120 comprises a unique silicon nitride ($Si_3N_4$) layer having significantly reduced hydrogen content. For example, hydrogen content in nitride layer 120 may be in the range of about 0 to 0.5 atomic percent, which is a significant hydrogen content reduction over conventional nitride layers having a hydrogen content of about 1 to 2 atomic percent. As described below in conjunction with FIGS. 3 and 4, a unique fabrication process is used to achieve the reduced hydrogen content in nitride layer 120. Second oxide layer 125 of ONO stack 105 also comprises oxide and is situated over nitride layer 120. Gate layer 130 is situated over second oxide layer 125.

Due to the reduced hydrogen content in nitride layer 120, the amount of hydrogen radicals than can be freed in nitride layer 120 during subsequent programming operations is greatly reduced. Consequently, the charge loss in nitride layer 120 is significantly reduced. As a benefit, the reduction of charge loss in nitride layer 120 significantly reduces the threshold voltage shift in resulting memory cell structure 100. Furthermore, the reduction of charge loss in nitride layer 120 results in reduced potential for program data loss and reduced potential for programming capability loss in memory cell structure 100. As another benefit, the reduced hydrogen content in nitride layer 120 further reduces the amount of hydrogen migration into adjacent silicon oxide layers, such as first oxide layer 115 and second oxide layer 125. In sum, memory cell structure 100 results in a memory device having significantly improved performance.

Figure 2:
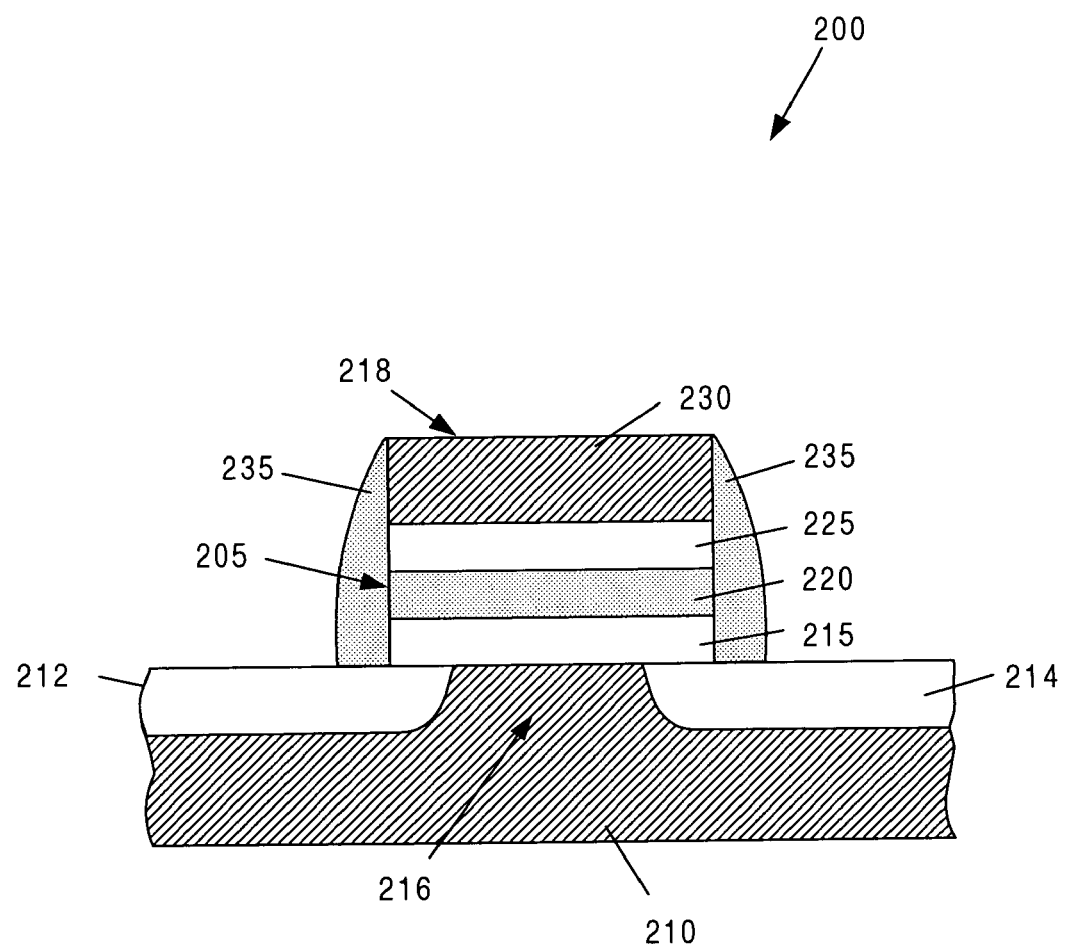
FIG. 2 depicts an exemplary memory cell structure having a nitride layer and nitride spacers with significantly reduced charge loss according to one embodiment of the present invention.

FIG. 2 depicts exemplary memory cell structure 200 according to one embodiment of the present invention. Similar to FIG. 1, memory cell structure 200 comprises silicon substrate 210 and gate stack 218 situated over channel region 216 of substrate 210. Terminal region 212 and terminal region 214 are formed opposite each other across channel region 216 of substrate 210.

Gate stack 218 comprises ONO stack 205 and gate layer 230, wherein ONO stack 205 and gate layer 230 respectively correspond to ONO stack 105 and gate layer 130 in FIG. 1. As such, nitride layer 220, which is positioned between first oxide layer 215 and second oxide layer 225 of ONO stack 205, comprises a nitride layer having significantly reduced hydrogen content, as described above in conjunction with nitride layer 120 of FIG. 1, and thus, nitride layer 220 has significantly reduced charge loss.

Continuing with FIG. 2, spacers 235 are formed on the sidewalls of gate stack 218. Like nitride layer 220 of ONO stack 205, spacers 235 comprise nitride having significantly reduced hydrogen content, e.g., in the range of about 0 to 0.5 atomic percent in contrast with conventional range of approximately 1 to 2 atomic percent. Due to the significantly reduced hydrogen content in spacers 235, a substantially reduced amount of hydrogen will find its way to nitride layer 220 of ONO stack 205 which will in turn result in reducing the presence of hydrogen radicals in nitride layer 220 and, ultimately, reducing the charge loss in nitride layer 220. In other words, in a conventional memory cell, spacers 235, which are adjacent to ONO stack 205, become another source of hydrogen and eventual charge loss in nitride layer 220, thereby further compounding the above-discussed negative effects in conventional memory cell structures, and resulting in further degraded memory device performance. In contrast, according to the invention, threshold voltage shift, the potential for program data loss, and the potential for programming capability loss in memory cell structure 200 are all significantly reduced, resulting in improved memory device performance. In addition, the reduced hydrogen content in spacers 235 reduces the amount of hydrogen migration into adjacent silicon oxide layers, such as first oxide layer 215 and second oxide layer 225.

Figure 3:
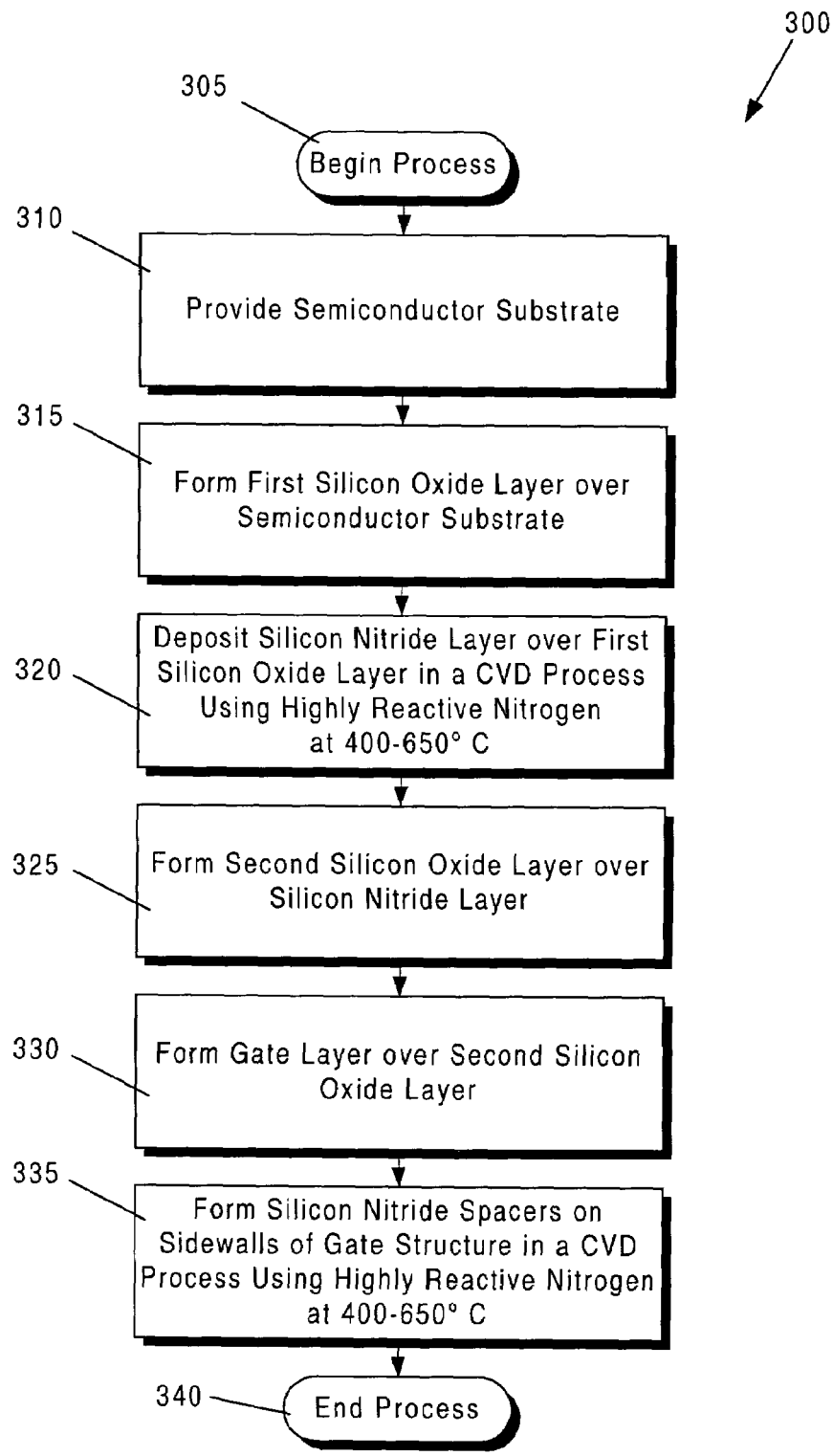
FIG. 3 depicts an exemplary flow chart for fabricating a memory cell structure according to one embodiment of the invention.

Referring now to FIG. 3, flow chart 300 shows an exemplary method for fabricating a memory cell structure according to one embodiment of the invention. Certain details and features have been left out of flow chart 300 of FIG. 3 that are apparent to a person of ordinary skill in the art. For example, a step may consist of one or more sub-steps or may involve specialized equipment or materials, as known in the art. While steps 305 through 340 shown in flow chart 300 are sufficient to describe one embodiment of the present invention, other embodiments of the invention may utilize steps different from those shown in flow chart 300.

The method begins at step 305, and at step 310, a semiconductor substrate is provided. For example, with reference to FIG. 2, semiconductor substrate 210 having terminal region 212 spaced apart from terminal region 214 by channel region 216 may be provided during step 310. Next at step 315, a first oxide layer is formed over the channel region of the substrate. For example, with reference to FIG. 2, first oxide layer 215 is formed over channel region 216 during step 315.

At step 320, a unique CVD process is used to form a nitride layer having reduced charge loss over the first oxide layer. In an exemplary embodiment, a precursor comprising silane and a highly reactive form of nitrogen is used in a CVD process at a temperature of about 400 to 650° C. For example, microwave energy, or other similar processing, may be use to break up nitrogen ($N_2$) into a highly reactive form of nitrogen, i.e. to form "nitrogen radicals". With the unique CVD process described above, a nitride layer having significantly reduced hydrogen content is achieved. As discussed above, the reduced hydrogen content in the nitride layer results in a nitride layer having reduced charge loss. With reference to FIG. 2, nitride layer 220 is formed over first oxide layer 215 during step 320.

At step 325, a second oxide layer is formed over the nitride layer. The first oxide layer, the nitride layer, and the second oxide layer form an ONO stack. For example, with reference to FIG. 2, second oxide layer 225 is formed over nitride layer 220 during step 325 to form ONO stack 205. At step 330, a gate layer is formed over the second oxide layer of the ONO stack to form a gate stack. For example, with reference to FIG. 2, gate layer 230 may be formed over second oxide layer 225 to form gate stack 218.

If desired, there can be an additional step, such as step 335, in which the invention's unique CVD process discussed above is utilized to form spacers on the sidewalls of the gate stack. It is noted that step 335 requires a number of prerequisite steps and various sub-steps that are not shown or discussed herein to preserve simplicity. Thus, spacers, each having reduced hydrogen content, are formed on the sidewall of the gate stack. As discussed above, in an exemplary embodiment, a precursor comprising silane and a highly reactive form of nitrogen is used in a CVD process at a temperature of about 400 to 650° C. to form the nitride film which forms the spacers. Due to this unique CVD process, nitride spacers having significantly reduced hydrogen content are achieved. With reference to FIG. 2, spacers 235 are formed on the sidewalls of gate stack 218 during step 335. The exemplary process is completed at step 340, although additional fabrication processes may also be performed before, during, and/or after the steps shown in flow chart 300.

Figure 4:
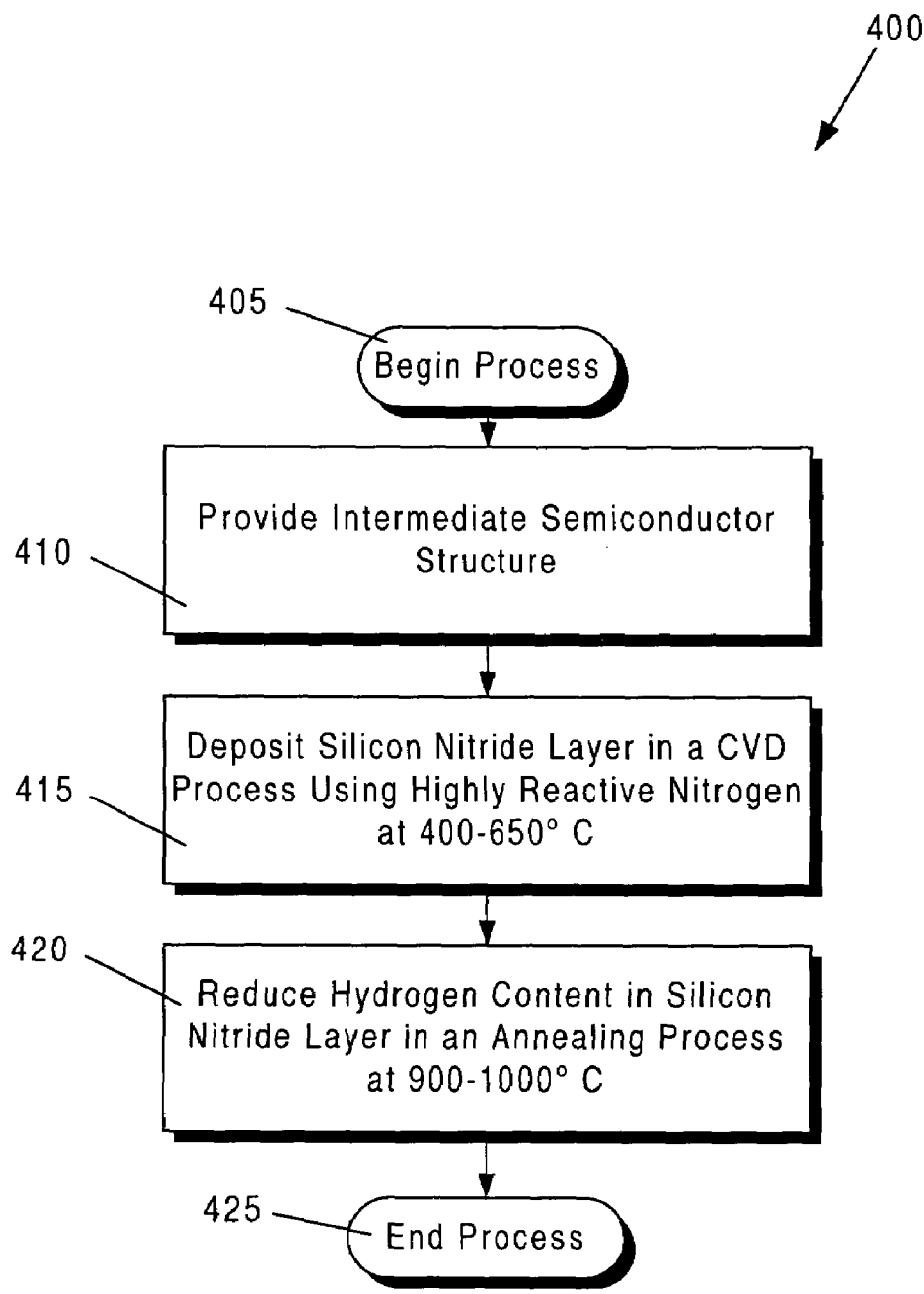
FIG. 4 depicts an exemplary flow chart for fabricating a nitride layer according to one embodiment of the invention.

Referring now to FIG. 4, flow chart 400 shows an exemplary method for fabricating a nitride layer according to one embodiment of the invention. Certain details and features have been left out of flow chart 400 of FIG. 4 that are apparent to a person of ordinary skill in the art. For example, a step may consist of one or more sub-steps or may involve specialized equipment or materials, as known in the art. While steps 405 through 425 shown in flow chart 400 are sufficient to describe one embodiment of the present invention, other embodiments of the invention may utilize steps different from those shown in flow chart 400.

The process shown in flow chart 400 can be used for forming such features as nitride layer 220 and spacers 235 in memory cell structure 200 of FIG. 2, for example. Indeed, flow chart 400 can be used in a number of semiconductor fabrication applications for forming a nitride layer or nitride film having reduced hydrogen content in order to achieve reduced charge loss.

The method begins at step 405, and at step 410, an intermediate semiconductor structure is provided. The intermediate semiconductor structure has a region on which a nitride layer having reduced charge loss is to be fabricated. With reference to FIG. 2, an example of an intermediate semiconductor structure is substrate 210 having first oxide layer 215 thereon, where the present method is used to form nitride layer 220 over first oxide layer 215. Another example of an intermediate semiconductor structure is substrate 210 having gate stack 218 thereon, where the present method is used to form spacers 235 on the sidewalls of gate stack 218 of FIG. 2.

At step 415, the invention's unique CVD process discussed above is used to form a nitride layer having reduced hydrogen content over the intermediate semiconductor structure. As discussed above, in an exemplary embodiment, a precursor comprising silane and a highly reactive form of nitrogen is used in a CVD process at a temperature of about 400 to 650° C. to form the nitride layer. Due to this unique CVD process, a nitride layer having significantly reduced hydrogen content is achieved. As discussed above, the reduced hydrogen content in the nitride layer results in reduced charge loss in the nitride layer.

At step 420, an annealing process at a temperature higher than that used during the CVD process of step 415 is used to further reduce the hydrogen content in the nitride layer formed during step 415. In an exemplary embodiment, an annealing process at a temperature in the range of about 900–1000° C. using an ambient of oxygen ($O_2$) or nitrous oxide ($N_2O$) is used to free additional hydrogen atoms from the nitride layer, further reducing the hydrogen content in the nitride layer formed during step 415. Thus, the charge loss in the nitride layer is even further reduced during step 420. When used to fabricate nitride layer 220 of memory cell structure 200 of FIG. 2, for example, memory device performance is even further improved due to the significant decrease in charge loss in the nitride layer. The exemplary process is completed at step 425, although additional fabrication processes may also be performed before, during, and/or after flow chart 400.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention.

For example, the unique nitride layer forming process of the present invention can be used to fabricate nitride layers in devices other than a MirrorBit™ memory device, such as, for example, a floating gate memory device. In that case, i.e. when the unique nitride layer forming process of the invention is used in a floating gate memory device, the ONO stack is situated over a polysilicon floating gate where the polysilicon floating gate is separated from the silicon substrate by a tunnel oxide layer. Situated on top of the ONO stack, in a floating gate memory device, is typically a polysilicon control gate. The mechanisms by which the invention's unique nitride layer is advantageous are similar to those described above. For example, due to the low-hydrogen content of the nitride layer in the ONO stack, fewer hydrogen radicals are generated which, in turn, prevents threshold voltage shift, charge loss, hydrogen diffusion into adjacent layers, which prevent performance degradation and reliability problems in the floating gate memory device.

The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, a memory cell structure having nitride layer with reduced charge loss and method for fabricating same have been described.

We claim:

1. A memory cell structure comprising:
   a semiconductor substrate;
   a first silicon oxide layer situated over said semiconductor substrate;
   a charge storing layer formed from nitrogen radicals and situated over said first silicon oxide layer, said charge storing layer comprising silicon nitride having reduced hydrogen content, said reduced hydrogen content reducing charge loss in said charge storing layer;
   a second silicon oxide layer situated over said charge storing layer;
   a gate layer situated over said second silicon oxide layer.

2. The memory cell structure of claim 1, further comprising:
   said first silicon oxide layer, said charge storing layer, said second silicon oxide layer, and said gate layer forming a gate stack, said gate stack having a sidewall;
   a spacer adjacent to said sidewall of said gate stack, said spacer comprising silicon nitride having reduced hydrogen content, said reduced hydrogen content reducing charge loss in said charge storing layer.

3. The memory cell structure of claim 2, wherein said gate stack is situated over a channel region in said semiconductor substrate, said channel region situated between a first terminal region and a second terminal region.

4. The memory cell structure of claim 1, wherein said charge storing layer has a hydrogen content less than 1.0 atomic percent.

5. The memory cell structure of claim 1, wherein said charge storing layer has a hydrogen content between 0 and 0.5 atomic percent.

6. The memory cell structure of claim 1, wherein said charge storing layer is capable of storing two bits.

7. A memory cell structure comprising:
   a semiconductor substrate, a first silicon oxide layer situated over said semiconductor substrate, a charge storing layer situated over said first silicon oxide layer, a second silicon oxide layer situated over said charge storing layer, a gate layer situated over said second silicon oxide layer, said memory cell structure characterized by:
   said charge storing layer formed from nitrogen radicals and comprising silicon nitride having reduced hydrogen content;
   said reduced hydrogen content reducing charge loss in said charge storing layer.

8. The memory cell structure of claim 7, further comprising said first silicon oxide layer, said charge storing layer, said second silicon oxide layer, and said gate layer forming a gate stack, said gate stack having a sidewall;
   a spacer adjacent to said sidewall of said gate stack, said spacer comprising silicon nitride having reduced hydrogen content, said reduced hydrogen content reducing charge loss in said charge storing layer.

9. The memory cell structure of claim 7, wherein said gate stack is situated over a channel region in said semiconductor substrate, said channel region situated between a first terminal region and a second terminal region.

10. The memory cell structure of claim 7, wherein said charge storing layer has a hydrogen content less than 1.0 atomic percent.

11. The memory cell structure of claim 7, wherein said charge storing layer has a hydrogen content between 0 to 0.5 atomic percent.

12. The memory cell structure of claim 7, wherein said charge storing layer is capable of storing two bits.

* * * * *